United States Patent
Park et al.

(10) Patent No.: US 7,239,216 B2
(45) Date of Patent: Jul. 3, 2007

(54) SEMICONDUCTOR MEMORY DEVICE WITH DATA BUS SCHEME FOR REDUCING HIGH FREQUENCY NOISE

(75) Inventors: Myun-Joo Park, Incheon (KR); Jae-Jun Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 10/424,923

(22) Filed: Apr. 29, 2003

(65) Prior Publication Data

US 2003/0223290 A1  Dec. 4, 2003

(30) Foreign Application Priority Data

Jun. 4, 2002  (KR) .................. 10-2002-0031410

(51) Int. Cl.
*H01P 5/12* (2006.01)
(52) U.S. Cl. .................. 333/126; 333/204; 333/246
(58) Field of Classification Search ............... 333/126, 333/128, 245, 246, 204, 185
See application file for complete search history.

(56) References Cited

U.S. PATENT DOCUMENTS

| | | | | |
|---|---|---|---|---|
| 3,680,002 A | * | 7/1972 | Quine ..................... | 331/96 |
| 5,150,084 A | * | 9/1992 | Asa et al. ................ | 333/128 |
| 5,291,161 A | * | 3/1994 | Saka ....................... | 333/204 |
| 5,311,157 A | * | 5/1994 | D'Oro et al. ............ | 333/132 |
| 6,201,613 B1 | * | 3/2001 | Zhang et al. ............ | 358/1.9 |
| 6,428,015 B1 | * | 8/2002 | Iwakata ................... | 277/563 |
| 6,442,104 B1 | * | 8/2002 | Ridgell et al. .......... | 367/1 |
| 6,504,448 B1 | * | 1/2003 | Yip ......................... | 333/33 |
| 6,525,630 B1 | * | 2/2003 | Zhu et al. ................ | 333/205 |
| 6,646,945 B1 | * | 11/2003 | Lee et al. ................ | 365/226 |
| 2002/0056080 A1 | * | 5/2002 | Nakamoto et al. ..... | 725/1 |

FOREIGN PATENT DOCUMENTS

KR    A 1994-16243    7/1994

* cited by examiner

*Primary Examiner*—Timothy P. Callahan
*Assistant Examiner*—An T. Luu
(74) *Attorney, Agent, or Firm*—Volentine & Whitt, PLLC

(57) ABSTRACT

A semiconductor memory device includes memory modules which have memories and a data bus which transfers data to the memory modules, in which the data bus comprises a low frequency band data pass unit which removes the high frequency component of the data and sends the data to the memory modules. The low frequency band data pass unit comprises a plurality of stubs which are connected to the data bus in parallel and are formed as printed circuit board (PCB) patterns. The low frequency band data pass unit comprises a plurality of plates that are connected to the data bus in parallel and are formed as PCB patterns. The low frequency band data pass unit has a shape in which parts having a wide width and parts having a narrow width are alternately connected. Therefore, without adding a separate passive device, the semiconductor memory device reduces the high frequency noise of data transferred through a data bus such that the voltage margin of the data improves, the cost for passive devices such as capacitors, is reduced, and the process for attaching the passive devices is simplified.

14 Claims, 5 Drawing Sheets

SEMICONDUCTOR MEMORY DEVICE WITH DATA BUS SCHEME FOR REDUCING HIGH FREQUENCY NOISE

CROSS REFERENCES TO RELATED APPLICATIONS

This application claims priority under 35 U.S.C. §119 from Korean Patent Application No. 2002-31410, filed on Jun. 4, 2002, the contents of which are hereby incorporated by reference in their entirety for all purposes as if fully set forth herein.

BACKGROUND AND SUMMARY

1. Technical Field

The present invention relates to a semiconductor memory device, and more particularly, to a semiconductor memory device having a data bus structure which reduces high frequency noise to data and passes only data having a low frequency.

2. Description of the Related Art

Semiconductor memory devices have been developed focusing on high integration and high capacity based on the high integration, while central processing units (CPUs) that are cores of computer system have been developed mainly focusing on high speed operation.

As a result, the difference between the operation speeds of the CPUs and memory devices continues to increase such that the operation speed of the memory devices becomes a major factor limiting the performance of a computer system.

In addition, in line with the recent trend in the memory, systems toward high speed and low power consumption, the operating voltage of a computer system is being lowered. With the operating voltage being reduced or lowered, the voltage level of a signal used for input and/or output data in a memory system is also being lowered.

However, since in line with the increasing operation speed, high frequency noise occurring in a computer system continues to increase, it is increasingly difficult to secure a voltage margin needed in system operation.

In order to secure a voltage margin of a signal needed in a system operating at high speed, the structure of the bus channel of the system should be optimized so that the signal voltage is maximized and high frequency noise occurring in the system is minimized.

FIG. 1 is a schematic diagram showing an ordinary stub-type memory bus structure. Referring to FIG. 1, in the ordinary stub-type memory bus structure 100, a bus 160 is arranged on a system board, and each memory device 130 on a memory module 140 is connected to the bus 160 through a stub 150 corresponding to the memory device 130 on the memory module 140. A stub 150 has a shape that branches from the bus 160 passing through a module socket 120.

In the bus structure 100 using the prior art stubs shown in FIG. 1, the entire length of a channel, that is, the bus 160, is short, and accordingly, the propagation time of a signal on the channel is short and the electromagnetic interference is small.

However, by the stub structure, discontinuity and impedance mismatching on the channel occur causing reflected wave noise. Accordingly, due to the effect of reflected wave noise, at a high speed operation, serious distortion occurs in the waveform of a signal on the channel and high speed operation of the memory system is restricted.

That is, in the stub-type bus structure, due to the reflected wave noise on the channel, signal integrity degrades.

Therefore, in the stub-type bus structure 100, a stub resistor is generally used on a bus to lessen the degradation of signal integrity due to the reflected wave noise on the channel. The stub resistor is serially connected to the channel.

However, the stub resistor reduces the high frequency noise, and at the same time reduces the signal voltage on the channel such that if a low signal power is used, the size of a signal is further reduced.

Recently, in order to solve this problem, a method in which a serial resistor used for impedance matching on the channel is replaced by a parallel capacitor has been introduced. Though this method lessens signal voltage reduction caused by a serial resistor for channel matching, this method requires a complicated manufacturing process to add a capacitor to the channel in parallel.

To solve the above problems, it would be desirable to provide a semiconductor memory device having a data bus structure in which using only a printed circuit board (PCB) pattern, high frequency noise is removed and only low frequency band data is transferred.

According to an aspect of the present invention, there is provided a semiconductor memory device comprising memory modules which have memories, and a data bus which transfers data to the memory modules, wherein the data bus comprises a low frequency band data pass unit which removes a high frequency component of the data and sends the data to the memory modules.

The low frequency band data pass unit comprises a plurality of stubs which are connected to the data bus in parallel and are formed as printed circuit board (PCB) patterns.

An end of each of the stubs, the end which is not connected to the data bus, is open.

The low frequency band data pass unit comprises a plurality of plates which are connected to the data bus in parallel and are formed as PCB patterns.

The plates are connected to the data bus through short lines formed as PCB patterns.

The low frequency band data pass unit has a shape in which parts having a first, wide, width and parts having a second, narrow, width are alternately connected.

The low frequency band data pass unit has a shape in which line parts having high impedance and line parts having low impedance are alternately connected.

According to another aspect of the present invention, there is provided a semiconductor memory device having memory modules, which have memories, and a data bus which transfers data to the memory modules, comprising a plurality of stubs which are connected to the data bus in parallel and are formed as PCB patterns.

An end of each of the stubs, the end which is not connected to the data bus, is open.

According to still another aspect of the present invention, there is provided a semiconductor memory device having memory modules, which have memories, and a data bus which transfers data to the memory modules, comprising a plurality of plates which are connected to the data bus in parallel and are formed as PCB patterns.

The plates are connected to the data bus through short lines formed as PCB patterns.

According to yet still another aspect of the present invention, there is provided a semiconductor memory device comprising memory modules which have memories and a data bus which transfers data to the memory modules, wherein the data bus has a shape in which parts having a first, wide, width and parts having a second, narrow, width are alternately connected.

That is, a semiconductor memory device comprising memory modules which have memories and a data bus which transfers data to the memory modules, wherein the data bus has a shape in which line parts having high impedance and line parts having low impedance are alternately connected.

Therefore, without adding a separate discrete passive device, a semiconductor memory device as disclosed herein can reduce the high frequency noise of data transferred through a data bus such that the voltage margin of the data improves, the cost for passive devices such as capacitors is reduced, and the process for attaching the passive devices is simplified.

BRIEF DESCRIPTION OF THE DRAWINGS

The above objects and advantages of the present invention will become more apparent by describing in detail preferred embodiments thereof with reference to the attached drawings in which.

DETAILED DESCRIPTION

Figure 1:
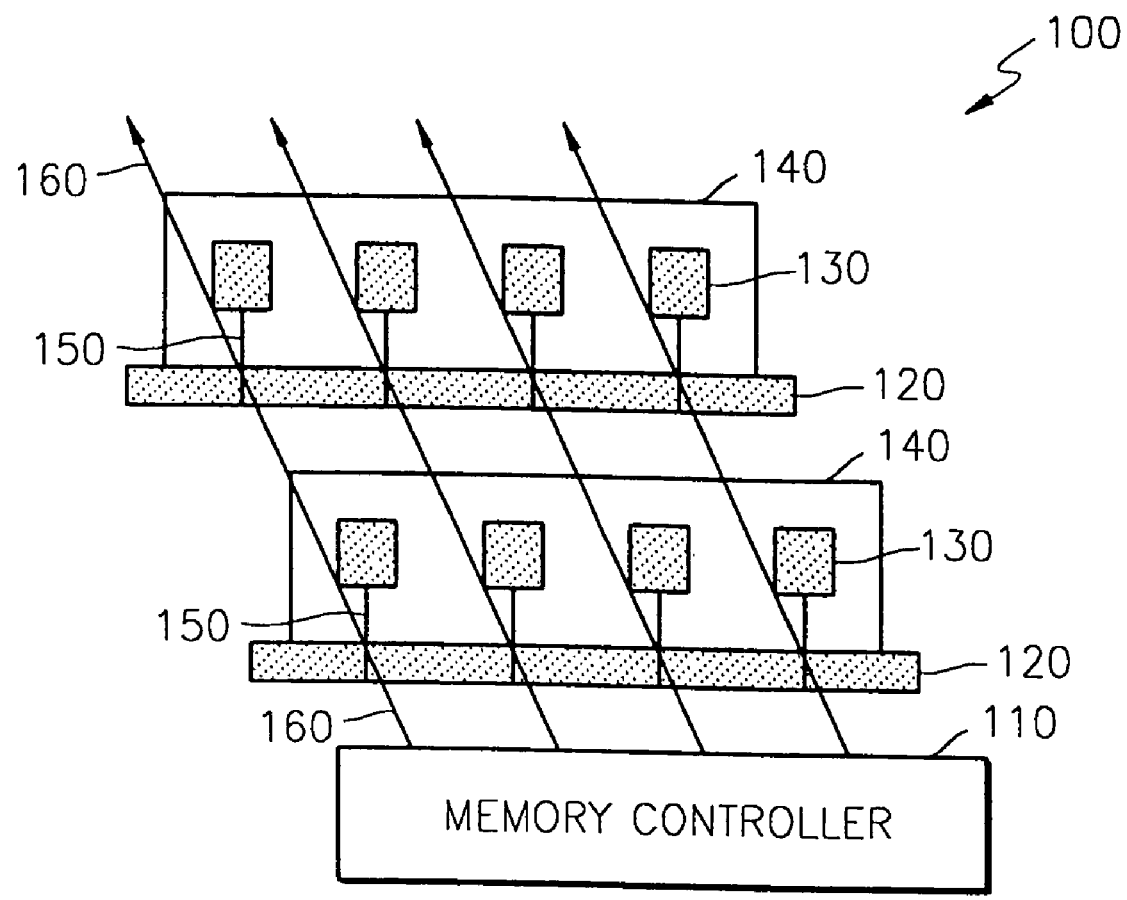
FIG. 1 is a schematic diagram showing a stub-type memory bus structure.
Figure 2:
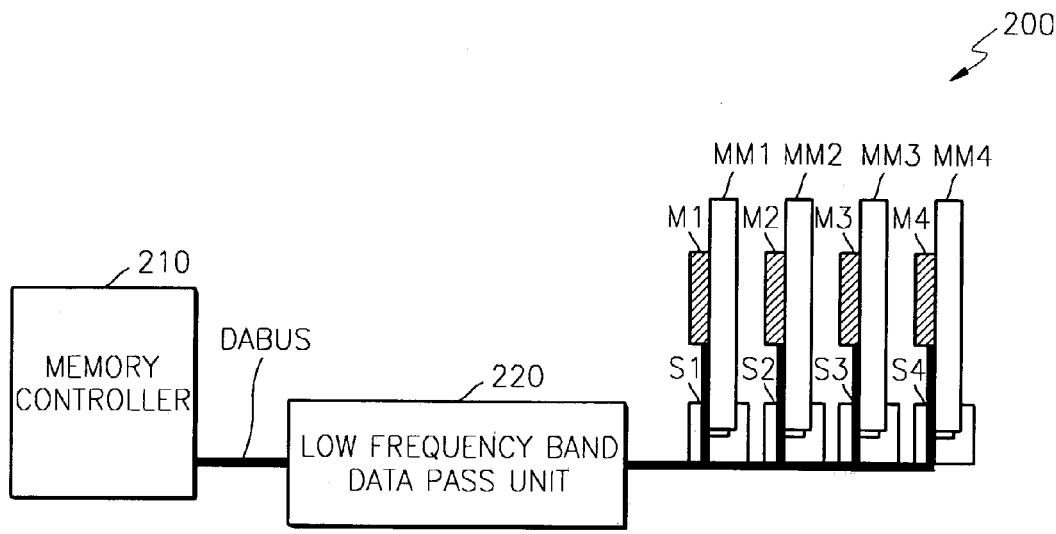
FIG. 2 is a schematic diagram showing a semiconductor memory device according to a first preferred embodiment.

FIG. 2 is a schematic diagram showing a semiconductor memory device according to a first preferred embodiment.

Referring to FIG. 2, the semiconductor memory device 200 according to the first preferred embodiment comprises a plurality of memory modules MM1 through MM4, having respective memories M1 through M4, and a data bus (DABUS) which transfers data to the memory modules MM1 through MM4. The data bus (DABUS) includes a low frequency band data pass unit 220 which removes the high frequency component of data above a certain "cut-off" frequency, and transfers the filtered data to the memory modules MM1 through MM4.

The operation of the semiconductor memory device according to the first preferred embodiment will now be explained in detail referring to FIG. 2.

FIG. 2 shows the memory controller 210 which controls the memories M1 through M4, the memory modules MM1 through MM4, having respective memories M1 through M4, and slots S1 through S4 to which the memory modules MM1 through MM4 are mounted.

The memory controller 210 and memories M1 through M4 are connected through the data bus (DABUS).

The data bus (DABUS) includes the low frequency band data pass unit 220 which removes the high frequency component of data, and transfers the data to the memory modules MM1 through MM4.

The low frequency band data pass unit 220 functions as a low pass filter which reduces the high frequency component of data, to reduce high frequency noise caused by high frequency components of the data, and passes only the low frequency components of the data. Beneficially, the low frequency band data pass unit 220 is formed as a PCB pattern.

In order to reduce the high frequency noise, discrete passive devices such as capacitors may be attached to a data bus (DABUS), but this introduces restrictions caused by problems in the process of attaching the capacitors.

In contrast, the semiconductor memory device 200 of FIG. 2 includes the low frequency band data pass unit 220 which is formed by a PCB pattern, without using a separate, discrete passive device, and as a result, it is advantageous in price and manufacturing process. Also, such an arrangement increases design flexibility such that design of a variety of bus structures having different frequency characteristics becomes easier.

The structures of several embodiments of the low frequency band data pass unit 220 will now be explained in more detail.

Figure 3:
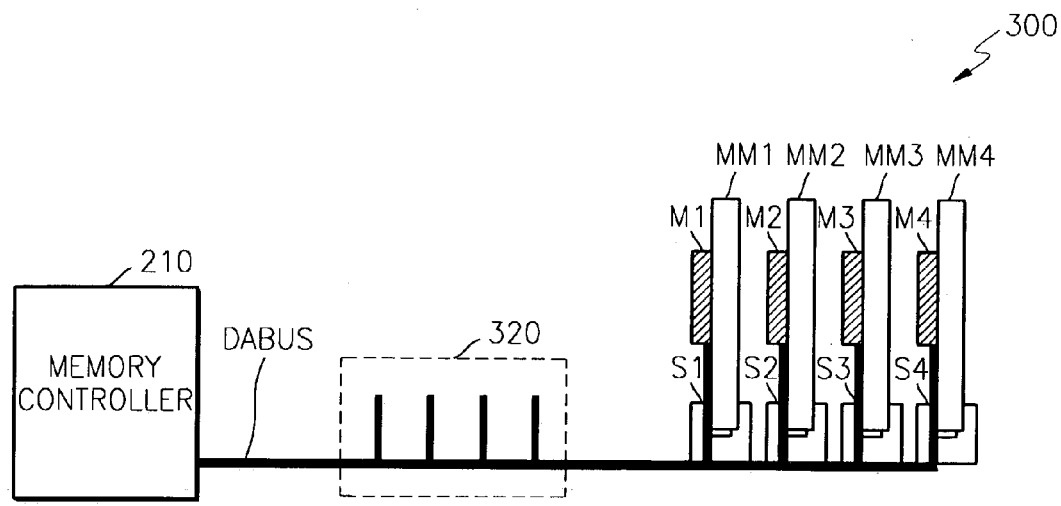
FIG. 3 is a schematic diagram showing a semiconductor memory device according to a second preferred embodiment.

As shown in FIG. 3, in one embodiment the low frequency band data pass unit includes a plurality of stubs formed in parallel. One end of each stub is connected to the "through-lines" of the data bus (DABUS). The other end of each stub is open (unconnected). Beneficially, the stubs are formed as printed circuit board (PCB) patterns. The operation of the embodiment shown in FIG. 3 will be explained later.

Figure 4:
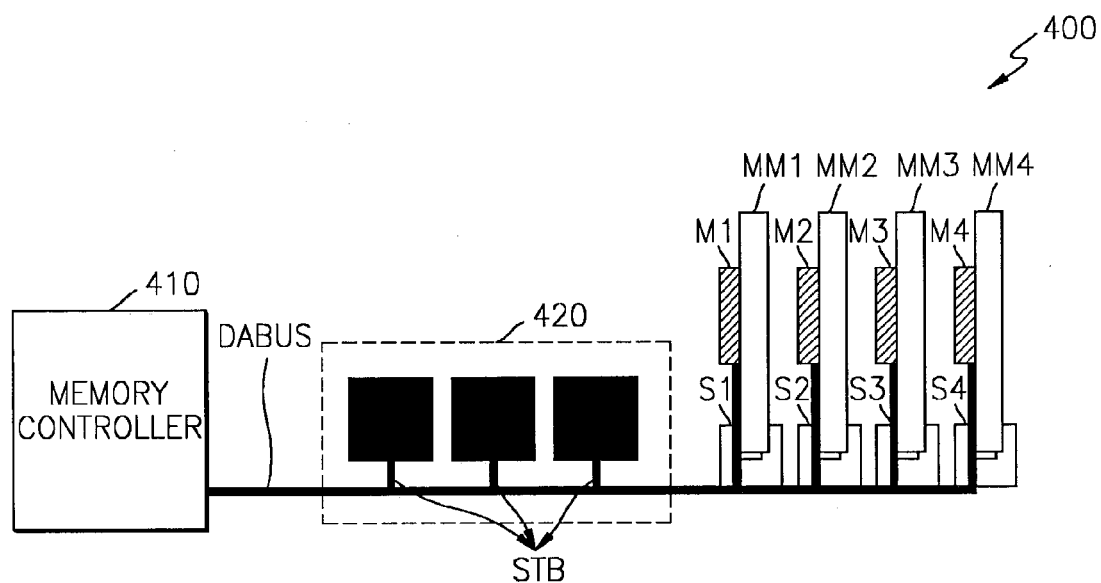
FIG. 4 is a schematic diagram showing a semiconductor memory device according to a third preferred embodiment.

As shown in FIG. 4, in another embodiment the low frequency band data pass unit includes a plurality of plates. The plates are connected to the "through-lines" of the data bus (DABUS) by short connection lines formed as PCB patterns. Beneficially, the plates are formed as printed circuit board (PCB) patterns. The operation of the embodiment shown in FIG. 4 will be explained later.

Figure 5:
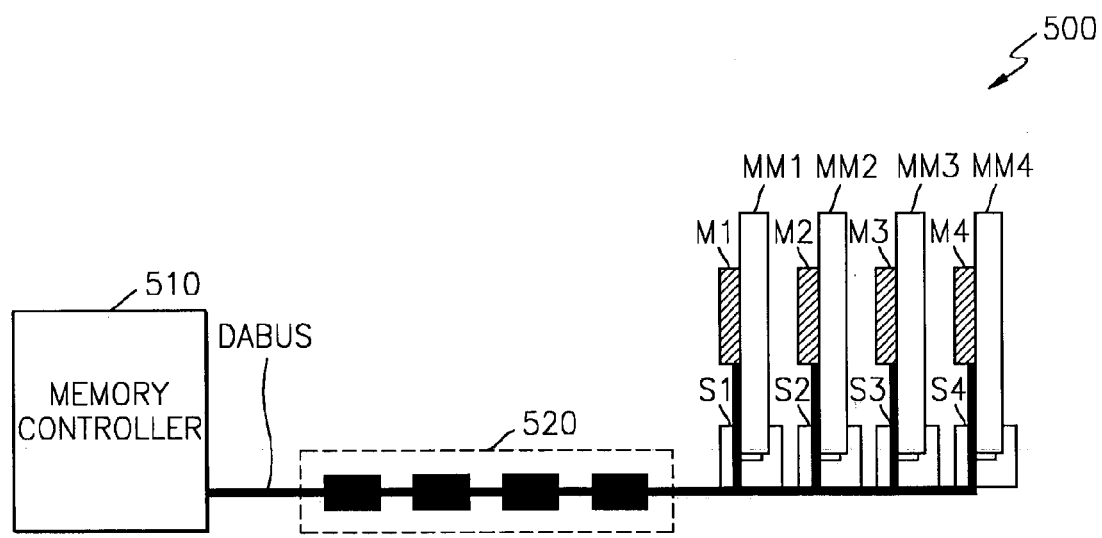
FIG. 5 is a schematic diagram showing a semiconductor memory device according to a fourth preferred embodiment.

As shown in FIG. 5, in another embodiment the low frequency band data pass unit has a shape wherein parts having a wide width and parts having a narrow width are alternately connected. Furthermore, the structure in FIG. 5 shows that the low frequency band data pass unit has a shape in which line parts having a high impedance, and line parts having a low impedance, are alternately connected. The operation of the embodiment shown in FIG. 5 will be explained later.

The three embodiments of the low frequency band data pass unit 220 described above commonly perform the function of a low pass filter which reduces the high frequency noise of data.

FIG. 3 is a schematic diagram showing a semiconductor memory device according to a second preferred embodiment.

Referring to FIG. 3, the semiconductor memory device 300 according to the second preferred embodiment comprises a plurality of memory modules MM1 through MM4, having respective memories M1 through M4, and a data bus (DABUS) which transfers data to the memory modules MM1 through MM4. The semiconductor memory device 300 has a plurality of stubs 320 that are formed as PCB patterns and are connected in parallel to the "through-lines" of the data bus (DABUS).

An end of each of the stubs 320, the end that is not connected to the "through-lines" of the data bus, is open or unconnected.

The stubs 320 of FIG. 3 perform the function of the low frequency band data pass unit 220 of FIG. 2. The stubs 320 are formed as PCB patterns, and, beneficially, are short lines. The stubs 320 are connected to the "through-lines" of the data bus (DABUS) in parallel.

The stubs 320 are made very short considering the wavelength of the data frequency, so that the stubs have the characteristics of capacitors in a desired signal band.

That is, the stubs 320 perform the function of capacitors connected to the "through-lines" of the data bus (DABUS) in parallel so that the stubs 320 play the role of a low pass filter. Therefore, the high frequency noise of the data is reduced and only the low frequency component of the data is transferred to the memory.

By changing the width, length, and arrangement of the stubs 320, a variety of low pass filters are implemented.

FIG. 4 is a schematic diagram showing a semiconductor memory device according to a third preferred embodiment.

Referring to FIG. 4, the semiconductor memory device 400 according to the third preferred embodiment comprises a plurality of memory modules MM1 through MM4, having respective memories M1 through M4, and a data bus (DABUS) which transfers data to the memory modules MM1 through MM4. The semiconductor memory device 400 has a plurality of plates 420 that are formed as PCB patterns and are connected to the "through-lines" of the data bus (DABUS) in parallel.

The plates 420 are connected to the "through-lines" of the data bus (DABUS) through short connection lines (STB) formed as PCB patterns.

The plates 420 of FIG. 4 perform the function of the low frequency band data pass unit 220 of FIG. 2. The plates are formed as PCB patterns, and form a plate capacitor between the system board (not shown) and a ground surface.

By adjusting the size of the plates 420, the amount of capacitance affecting the data bus can be controlled.

The data bus (DABUS) and the plates 420 connected to the "through-lines" of the data bus (DABUS) in parallel play the role of a low pass filter. Accordingly, the high frequency noise of the data is reduced and only low frequency components of the data are transferred to the memory.

FIG. 5 is a schematic diagram showing a semiconductor memory device according to a fourth preferred embodiment.

Referring to FIG. 5, the semiconductor memory device 500 according to the fourth preferred embodiment comprises a plurality of memory modules MM1 through MM4, having respective memories M1 through M4, and a data bus (DABUS) which transfers data to the memory modules MM1 through MM4. The data bus (DABUS) has a shape in which parts having a wide width and parts having a narrow width are alternately connected.

That is, in the semiconductor memory device 500 comprising a plurality of memory modules MM1 through MM4, having respective memories M1 through M4, and the data bus (DABUS) which transfers data to the memory modules MM1 through MM4, has a shape in which line parts having a high impedance and line parts having a low impedance are alternately connected.

The shape of the data bus (DABUS) of FIG. 5, in which parts having a wide width and parts having a narrow width are alternately connected, performs the function of the low frequency band data pass unit 220 of FIG. 2. That is, a part of the data bus (DABUS) having a wide width has low impedance, and a part of the data bus (DABUS) having a narrow width has high impedance. Because parts having high impedance and parts having low impedance are alternately connected, the shape of the data bus (DABUS), in which parts having a wide width and parts having a narrow width are alternately connected, plays the role of a low pass filter. Accordingly, the high frequency noise of the data is reduced and only low frequency component of the data is transferred to the memory.

Figure 6A:
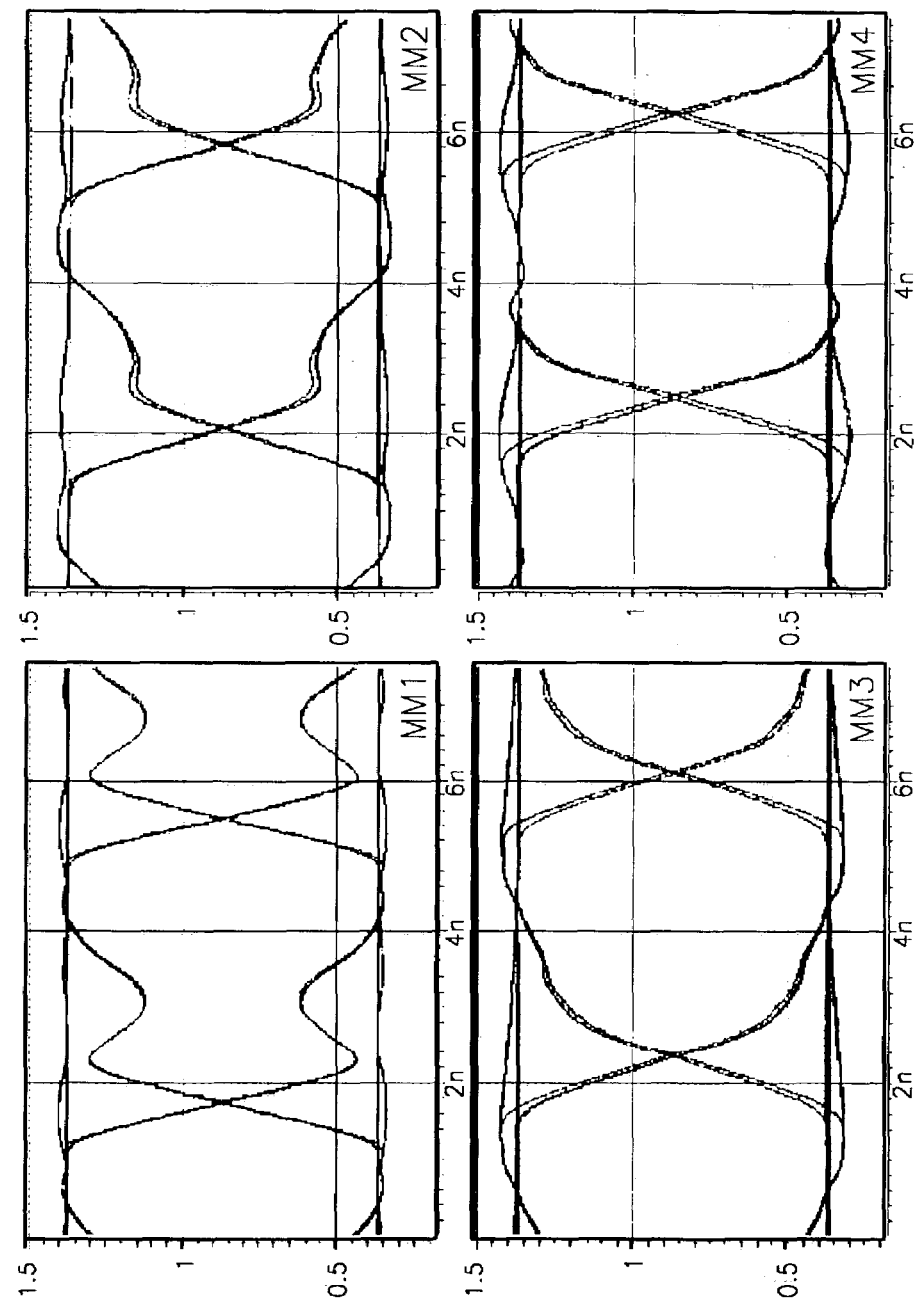
FIGS. 6(A) and 6(B) are graphs showing simulated operations of semiconductor memory devices according to the first through fourth preferred embodiments.
Figure 6B:
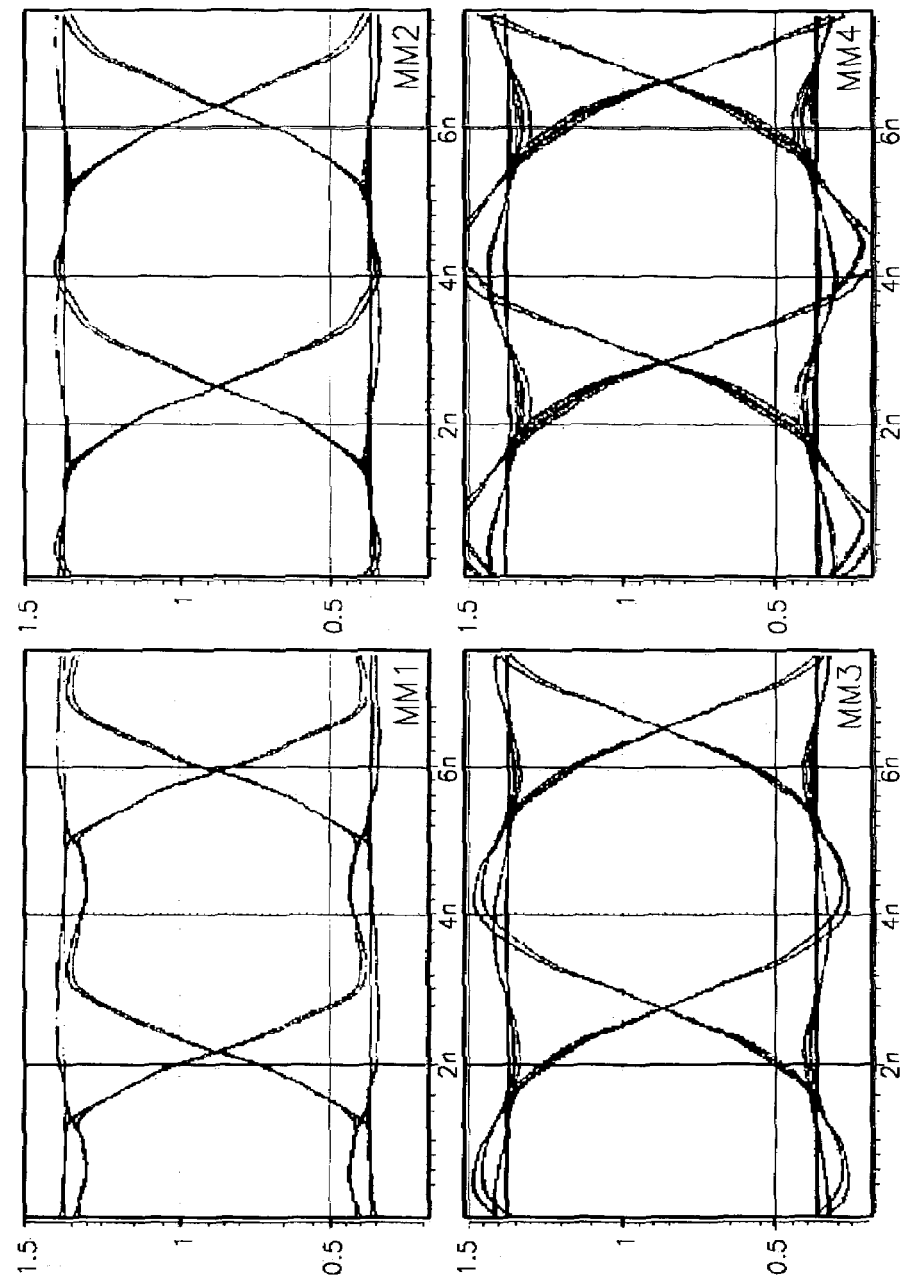

FIGS. 6(A) and 6(B) are graphs showing simulated operations of semiconductor memory devices according to the first through fourth preferred embodiments.

The data bus (DABUS) used in the simulation operates at a speed of 266 Mbps, with four memory slots S1 through S4 mounted into the modules MM1 through MM4.

In particular, FIG. 6 compare the waveform of a write operation when stubs, one end of each of which is open, are connected in parallel in the middle of the "through-lines" of the data bus (DABUS) by applying the method of the first preferred embodiment, and the waveform of a write operation when stubs are not used.

FIG. 6(A) shows the simulation when the stubs are not used.

Here, in the write operations in the first memory module (MM1) and the second memory module (MM2) in particular, the data voltage margin is substantially reduced because of undershoot.

FIG. 6(B) shows the simulation when the stubs are used.

Here, undershoot greatly decreases and the waveform of the data substantially improves as a whole.

As described above, the semiconductor memory device reduces the high frequency noise of data transferred through a data bus without adding a separate, discrete, passive device. As a result, the voltage margin of the data improves, the cost for passive devices such as capacitors is reduced, and the process for attaching the passive devices is simplified.

Particular embodiments have been explained above and are shown. However, the present invention is not restricted to the above-described embodiments and many variations are possible within the spirit and scope of the present invention. The scope of the present invention is not determined by the above description but by the accompanying claims.

What is claimed is:

1. A semiconductor memory device comprising:
    memory modules which have memories; and
    a data bus which transfers data to the memory modules,
        wherein the data bus includes a low frequency band data pass unit adapted to send the data to the memory modules and to remove a high frequency component of the data, and
        wherein the low frequency band data pass unit comprises a plurality of stubs which are arranged in parallel and are formed as printed circuit board (PCB) patterns.

2. The semiconductor memory device of claim 1, wherein one end of each of the stubs is open.

3. A semiconductor memory device comprising:
    memory modules which have memories; and
    a data bus which transfers data to the memory modules,
        wherein the data bus includes a low frequency band data pass unit adapted to send the data to the memory modules and to remove a high frequency component of the data, and
        wherein the low frequency band data pass unit comprises a plurality of plates that are arranged in parallel and are formed as PCB patterns.

4. The semiconductor memory device of claim 3, wherein the data bus includes through-lines, and wherein the plates are connected to the through-lines via connection lines formed as PCB patterns.

5. A semiconductor memory device comprising:
memory modules which have memories; and
a data bus which transfers data to the memory modules,
wherein the data bus includes a low frequency band data pass unit adapted to send the data to the memory modules and to remove a high frequency component of the data, and
wherein the low frequency band data pass unit has a shape in which parts having a first width and parts having a second width are alternately connected, where the first width is greater than the second width.

6. A semiconductor memory device comprising:
memory modules which have memories; and
a data bus which transfers data to the memory modules,
wherein the data bus includes a low frequency band data pass unit adapted to send the data to the memory modules and to remove a high frequency component of the data, and
wherein the low frequency band data pass unit has a shape in which line parts having high impedance and line parts having low impedance are alternately connected.

7. A semiconductor memory device comprising:
memory modules, which have memories;
a plurality of through-lines which transfer data to the memory modules; and
a plurality of stubs which are connected to the plurality of through-lines in parallel and are formed as PCB patterns.

8. The semiconductor memory device of claim 7, wherein an end of each of the stubs which is not connected to the though-lines, is open.

9. A semiconductor memory device comprising:
memory modules, which have memories;
plurality of through-lines which transfer data to the memory modules; and
a plurality of plates which are connected to the plurality of through-lines in parallel and are formed as PCB patterns.

10. The semiconductor memory device of claim 9, wherein the plates are connected to the plurality of though-lines via connection lines formed as PCB patterns.

11. A semiconductor memory device comprising:
memory modules which have memories; and
a data bus which transfers data to the memory modules,
wherein the data bus has a shape in which parts having a first width and parts having a second width are alternately connected, where the first width is greater than the second width.

12. The semiconductor memory device of claim 11, further comprising a memory controller connected to the memory modules via the data bus having the shape in which parts having the first width and parts having the second width are alternately connected, where the first width is greater than the second width.

13. A semiconductor memory device comprising:
memory modules which have memories; and
a data bus which transfers data to the memory modules,
wherein the data bus has a shape in which line parts having high impedance and line parts having low impedance are alternately connected.

14. The semiconductor memory device of claim 13, further comprising a memory controller connected to the memory modules via the data bus having the shape in which line parts having high impedance and line parts having low impedance are alternately connected.

* * * * *